(12) United States Patent
Na et al.

(10) Patent No.: US 11,733,082 B2
(45) Date of Patent: Aug. 22, 2023

(54) ELECTRONIC METER

(71) Applicant: AMOSENSE CO.,LTD, Cheonan-si (KR)

(72) Inventors: Won San Na, Seoul (KR); Jin Pyo Park, Seoul (KR); Bo Hyeon Han, Goyang-si (KR)

(73) Assignee: AMOSENSE CO., LTD, Chungcheongnam-do (KR)

( * ) Notice: Subject to any disclaimer, the term of this patent is extended or adjusted under 35 U.S.C. 154(b) by 578 days.

(21) Appl. No.: 16/634,291

(22) PCT Filed: Jul. 13, 2018

(86) PCT No.: PCT/KR2018/007954
§ 371 (c)(1),
(2) Date: Jan. 27, 2020

(87) PCT Pub. No.: WO2019/022416
PCT Pub. Date: Jan. 31, 2019

(65) Prior Publication Data
US 2020/0158551 A1    May 21, 2020

(30) Foreign Application Priority Data

Jul. 28, 2017  (KR) .......................... 10-2017-0096447
Jan. 24, 2018  (KR) .......................... 10-2018-0008829

(51) Int. Cl.
*G01R 21/133*    (2006.01)
*G01F 15/063*    (2022.01)
(Continued)

(52) U.S. Cl.
CPC ....... *G01F 15/063* (2013.01); *G01R 21/1333* (2013.01); *H02J 50/12* (2016.02); *G06V 30/10* (2022.01); *G06V 2201/02* (2022.01)

(58) Field of Classification Search
CPC ....... G01D 4/002; G01F 15/063; G01F 15/14; G01R 1/30; G01R 21/1333; G01R 22/063;
(Continued)

(56) References Cited

U.S. PATENT DOCUMENTS 7,605,485 B2 * 10/2009 Pitchford .............. G01F 15/063
                                                                290/43
7,880,641 B2 *  2/2011 Parris .................... G01F 15/185
                                                               700/282
(Continued)

FOREIGN PATENT DOCUMENTS

CN    202749913 U    2/2013
CN    203434644 U    2/2014
(Continued)

*Primary Examiner* — Vinh P Nguyen
(74) *Attorney, Agent, or Firm* — CL Intellectual LLC

(57) ABSTRACT

Presented is an electronic meter for supplying driving power to a battery module charged by wireless power transmission. The presented electronic meter includes a usage detection module for detecting energy usage of a consumer, a control module for generating meter data based on the energy usage detected by the usage detection module, a communication module for transmitting the meter data generated by the control module to a meter reading server or a repeater, a battery module composed of a secondary cell, and for supplying driving power to the usage detection module, the control module, and the communication module, and a wireless power receiving module for receiving power wirelessly from a wireless power transmission device to charge the battery module.

6 Claims, 5 Drawing Sheets

(51) Int. Cl.
*H02J 50/12* (2016.01)
*G06V 30/10* (2022.01)

(58) Field of Classification Search
CPC .. G06V 10/147; G06V 2201/02; G06V 30/10; G08C 17/02; H02J 13/00002; H02J 13/00022; H02J 50/10; H02J 50/12; H02J 7/0063; H04N 5/225; Y02B 90/20; Y02E 60/00; Y04S 10/30; Y04S 20/30
See application file for complete search history.

(56) References Cited

U.S. PATENT DOCUMENTS

| | | | | |
|---|---|---|---|---|
| 8,680,911 | B2 * | 3/2014 | Bingel | H03F 1/3211 |
| | | | | 327/321 |
| 8,922,162 | B2 * | 12/2014 | Park | H01F 38/14 |
| | | | | 320/108 |
| 9,166,276 | B2 * | 10/2015 | Chateau | H02J 7/007182 |
| 10,158,261 | B2 * | 12/2018 | Jang | H04B 5/0031 |
| 10,480,979 | B2 * | 11/2019 | Webster | G01F 3/20 |
| 11,139,672 | B2 * | 10/2021 | Jeon | H04B 5/0037 |
| 2010/0262442 | A1 | 10/2010 | Wingenter | |

FOREIGN PATENT DOCUMENTS

| | | |
|---|---|---|
| CN | 203704994 U | 7/2014 |
| CN | 104506825 A | 4/2015 |
| EP | 2378490 A1 | 3/2011 |
| KR | 2004-0000261 A | 1/2004 |
| KR | 20040000261 A * | 1/2004 |
| KR | 2013-0016588 A | 2/2013 |
| KR | 2013-0064903 A | 6/2013 |
| KR | 10-1721099 B1 | 3/2017 |

* cited by examiner

ELECTRONIC METER

CROSS-REFERENCE TO RELATED APPLICATIONS

This application is a National Stage of International patent application PCT/KR2018/007954, filed on Jul. 13, 2018, which claims priority to foreign Korean patent application No. KR 10-2017-0096447, filed on Jul. 28, 2017, and Korean patent application No. KR 10-2018-0008829, filed Jan. 24, 2018, the disclosures of which are incorporated by reference in their entireties.

FIELD OF THE INVENTION

The present disclosure relates to an electronic meter, and more particularly, to an electronic meter installed to a consumer to meter the usage of electricity, water, gas, and the like.

BACKGROUND

An Automatic Meter Reading (AMR) system collects, analyzes, and manages meter data from electronic meters installed to a consumer via a wired and wireless network. At this time, the Automatic Meter Reading system may also be referred to as an integrated meter reading system, an Advanced Metering Infrastructure (AMI) system, or the like.

For the automatic meter reading, the consumer is equipped with an electronic meter for reading the usage of electricity, water, gas, or the like to transmit it to an automatic meter reading server via a wired and wireless network.

In the electronic meter, a meter value is sensed by a sensing unit, and the sensed meter value may be not only displayed on an electronic display unit but also transmitted to the outside wirelessly. Therefore, the electronic meter is driven by using AC power directly connected, or operates by receiving driving power from an embedded battery or a rechargeable battery.

However, there is a problem in that the electronic meter which directly connects AC power to use it as driving power (hereinafter, referred to as an AC direct type electronic meter) has the complicated internal configuration (circuit) by adding an additional circuit such as a converter (for example, AC/DC), and as the internal configuration (circuit) becomes complicated, the power consumption increases and the maintenance cost increases.

An electronic meter which connects a battery to use it as driving power (hereinafter, referred to as a battery-embedded type electronic meter) has an advantage capable of simplifying an internal configuration (circuit) as compared with the AC direct type electronic meter.

However, since the battery-embedded type electronic meter uses a replaceable battery, the battery should be replaced if the battery is the end of life, and there is a problem in that it is difficult to replace the battery because the electronic meter is legally required to be sealed.

That is, the meter is sealed by a sealing device to be prevented from being manipulated arbitrarily. If the battery power is completely exhausted to require the replacement of the battery, it is necessary to dismantle the sealing device installed in the meter, and there occurs the inconvenience of having to reinstall the dismantled sealing device.

SUMMARY OF THE INVENTION

The present disclosure is intended to solve the above conventional problems, and an object of the present disclosure is to provide an electronic meter for supplying driving power to a battery module charged by wireless power transmission.

Further, another object of the present disclosure is to provide an electronic meter fastened to a pre-installed meter (that is, a mechanical meter, an electronic meter without communication function) to generate meter data through character recognition, and to transmit the meter data to a meter reading server or a repeater through a communication module.

For achieving the object, an electronic meter according to a first embodiment of the present disclosure includes a usage detection module for detecting energy usage of a consumer, a control module for generating meter data based on the energy usage detected by the usage detection module, a communication module for transmitting the meter data generated by the control module to a meter reading server or a repeater, a battery module composed of a secondary cell, and for supplying driving power to the usage detection module, the control module, and the communication module, and a wireless power receiving module for receiving power wirelessly from a wireless power transmission device to charge the battery module.

For achieving the object, an electronic meter according to a second embodiment of the present disclosure includes, as the electronic meter fastened to a mechanical meter installed to a consumer, a photographing module for photographing a character displayed on the mechanical meter to generate a meter image, a control module for generating meter data based on the energy usage detected through character recognition for the meter image generated by the photographing module, a communication module for transmitting the meter data generated by the control module to a meter reading server or a repeater, a battery module composed of a secondary cell, and for supplying driving power to the usage detection module, the control module, and the communication module, and a wireless power receiving module for receiving power wirelessly from a wireless power transmission device to charge the battery module.

The wireless power receiving module may receive power from the wireless power transmission device at a certain cycle interval to charge the battery module, or request wireless power transmission from the wireless power transmission device to charge the battery module if the charged amount of the battery module is a setting value or less.

According to the present disclosure, the electronic meter may supply driving power to the battery module charged by the wireless power transmission, thereby simplifying the internal configuration (circuit) as compared with the conventional AC direct type electronic meter. That is, the electronic meter may simplify the complicated circuit configuration such as the AC/DC converter required if the AC power is used as the driving power.

Further, the electronic meter may supply driving power to the battery module charged by the wireless power transmission to simplify the internal configuration, thereby minimizing the maintenance cost while reducing its own power consumption.

Further, the electronic meter may supply driving power to the battery module charged by the wireless power transmission, thereby facilitating the maintenance as compared with the conventional electronic meter using the replaceable battery. That is, the electronic meter may use the rechargeable battery, thereby minimizing the replacement of the battery and minimizing the disassembly of the sealed electronic meter.

Further, the electronic meter may be fastened to the pre-installed mechanical meter to generate the meter data through character recognition, thereby enabling the automatic meter reading even in the old meter.

Further, the electronic meter may be formed in a structure which is fastened to the pre-installed mechanical meter, thereby adding a sensor, a communication module, and the like for the automatic meter reading to the mechanical meter or the pre-installed electronic meter to enable the automatic meter reading even without replacing the meter.

Further, the electronic meter may wirelessly charge the rechargeable battery of the meter by using the wireless power receiving coil, thereby easily replenishing the power of the meter. Therefore, it is not necessary to dismantle the sealing device installed to the main body of the meter in order to replenish the power of the meter, thereby easily performing the operation of replenishing the power of the meter.

Further, the electronic meter may wirelessly transmit the meter data of the meter by using the wireless communication coil. Further, the wireless communication coil in one circuit board may be implemented integrally with the wireless power receiving coil. Therefore, it is possible to easily implement a configuration of enabling the wireless communication as well as the wireless charging to the meter.

Further, the electronic meter may be provided in the form in which the wireless power receiving coil surrounds the display unit, more particularly, the periphery of the display unit, thereby sufficiently securing the space where the wireless power receiving coil is disposed in the meter to minimize the time of charging the rechargeable battery. Further, in terms of the operation of charging the rechargeable battery, the operator may easily position the wireless power transmission module within a short distance of the wireless power receiving coil of the meter at the position of visually recognizing the display unit, thereby easily performing the operation of charging the rechargeable battery of the meter.

DETAILED DESCRIPTION

Figure 1:
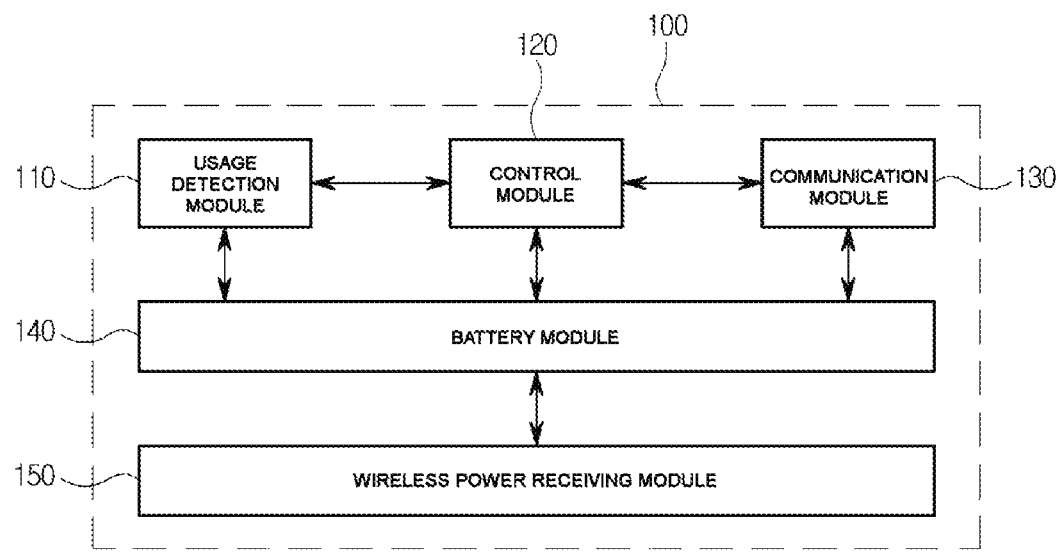
FIG. 1 is a diagram for explaining an electronic meter according to a first embodiment of the present disclosure.

Hereinafter, the most preferred embodiments of the present disclosure will be described with reference to the accompanying drawings in order to specifically describe so that those skilled in the art to which the present disclosure pertains may easily implement the technical spirit of the present disclosure. First, in adding reference numerals to the components of each drawing, it should be noted that the same components have the same reference numerals as much as possible even if they are displayed in different drawings. Further, in describing the present disclosure, when it is determined that the detailed description of the related well-known configuration or function may obscure the gist of the present disclosure, the detailed description thereof will be omitted.

An electronic meter according to a first embodiment of the present disclosure is installed to a consumer to read the energy usage (for example, the usage of electricity, water, gas, or the like) of the consumer to generate meter information. The electronic meter is coupled with a pipe to meter the flow rate of gas, water, or the like flowing along the pipe to generate meter information. The electronic meter meters the amount of powder flowing through the pipe or the amount of power flowing therethrough to generate the meter information.

The electronic meter transmits the meter information to a meter reading server via a wired and wireless network. At this time, the electronic meter may also transmit the meter information to the meter reading server through a repeater (for example, DCU).

The electronic meter embeds a battery (for example, a secondary cell) for supplying driving power, and charges the battery through wireless power transmission. At this time, the electronic meter may wirelessly receive power from a meter reading terminal carried by a meterman, a current transformer installed to a nearby power line, or the like to charge the battery.

Referring to FIG. 1, an electronic meter 100 according to a first embodiment of the present disclosure includes a usage detection module 110, a control module 120, a communication module 130, a battery module 140, and a wireless power receiving module 150.

The usage detection module 110 detects the energy usage of a consumer. That is, the usage detection module 110 detects the energy usage of electricity, water, gas, or the like. At this time, the usage detection module 110 is composed of various types of sensors such as an optical sensor, a gas sensor, a motion sensor, and an image sensor to detect the energy usage of the consumer.

For example, the usage detection module 110 includes a rotating body, such as an impeller, for rotating according to the flow of water and to which a magnet or a metal plate is attached, and a sensor for sensing the rotation of the rotating body, and measures the RPM of the rotating body according to the flow of water in order to detect the usage of water.

The control module 120 controls the usage detection module 110 to detect the energy usage at a setting time interval. The control module 120 may also control the usage detection module 110 to detect the energy usage in real time.

The control module 120 generates meter data by using the energy usage detected by the usage detection module 110. That is, the control module 120 converts the energy usage in the analog form measured by the usage detection module 110 into digital data to generate the meter data. At this time, the control module 120 may embed a storage module (for example, a memory) for storing the generated meter data.

The control module 120 controls the communication module 130 to transmit the meter data generated at the setting time interval to a meter reading server or a repeater. That is, the control module 120 transmits a transmission request including the meter data generated at the setting time interval to the communication module 130.

The communication module 130 transmits the meter data to the meter reading server or the repeater. That is, the communication module 130 is connected with the meter reading server or the repeater via a wired and wireless network. When receiving the transmission request from the control module 120, the communication module 130 transmits the meter data included in the transmission request to the meter reading server or the repeater via the wired and wireless network.

The battery module 140 supplies driving power to the usage detection module 110, the control module 120, and the communication module 130. That is, the battery module 140 charges power through wireless power transmission, and discharges the charged power to the usage detection module 110, the control module 120, and the communication module 130 to supply driving power. At this time, the battery module 140 is, for example, composed of a secondary cell such as a nickel cell, an ion cell, a lithium ion cell, a polymer cell, a lithium polymer cell, or a lithium sulfide cell.

The wireless power receiving module 150 receives the power transmitted from a wireless power transmission device to charge the battery module 140. That is, the wireless power receiving module 150 receives power from the wireless power transmission device through the wireless power transmission method such as a magnetic induction (MI) method or a magnetic resonance (MR) method. The wireless power receiving module 150 charges the battery module 140 by using the received power. At this time, the wireless power transmission device is, for example, a meter reading terminal or a current transformer installed to a nearby power line.

The wireless power receiving module 150 receives power from the wireless power transmission device at a certain cycle interval to charge the battery module 140. The wireless power receiving module 150 may request wireless power transmission to the wireless power transmission device to charge the battery module 140 if the charged amount of the battery module 140 is reduced to a setting value or less.

An electronic meter according to a second embodiment of the present disclosure is fastened to a mechanical meter installed to a consumer to generate meter data. The electronic meter transmits meter information to a meter reading server or a repeater via a wired and wireless network.

The electronic meter embeds a battery (for example, a secondary cell) for supplying driving power, and charges a battery through wireless power transmission. At this time, the electronic meter may wirelessly receive power from a meter reading terminal carried by a meterman, a current transformer installed to a nearby power line, or the like to charge the battery.

Figure 2:
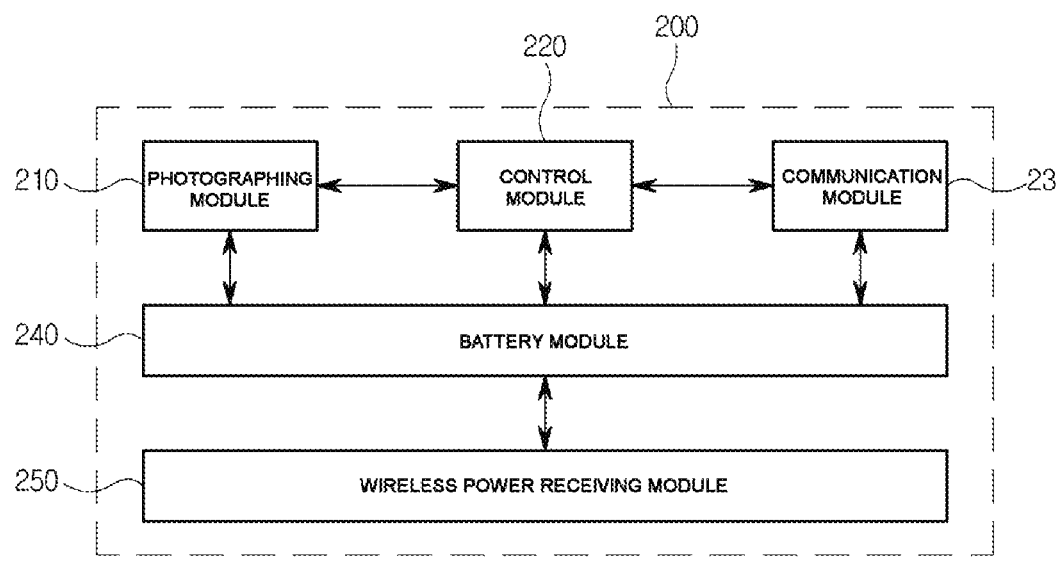
FIG. 2 is a diagram for explaining an electronic meter according to a second embodiment of the present disclosure.

Referring to FIG. 2, an electronic meter 200 according to a second embodiment of the present disclosure includes a photographing module 210, a control module 220, a communication module 230, a battery module 240, and a wireless power receiving module 250.

The photographing module 210 photographs the character displayed on a mechanical meter. That is, the photographing module 210 is composed of a camera module, and photographs the character (that is, energy consumption) displayed on the mechanical meter to generate the meter image. The photographing module 210 transmits the generated meter image to the control module 220.

The photographing module 210 generates the meter image at a setting time interval to transmit it to the control module 220. At this time, the photographing module 210 may also generate a real-time image as the meter image to transmit it to the control module 220.

The control module 220 controls the photographing module 210 to transmit the meter image at the setting time interval. The control module 220 may also control the photographing module 210 to transmit the meter image in real time.

The control module 220 generates meter data by using the meter image received from the photographing module 210. That is, the control module 220 generates the meter data through character recognition for the meter image. The control module 220 detects the energy usage through character recognition for a position where the energy usage has been displayed from the meter image. The control module 220 generates the meter data by using the detected energy usage. At this time, the control module 220 may embed a storage module (for example, a memory) for storing the generated meter data.

The control module 220 controls the communication module 230 to transmit the generated meter data at the setting time interval to the meter reading server or the repeater. That is, the control module 220 transmits a transmission request including the generated meter data at the setting time interval to the communication module 230.

The communication module 230 transmits the meter data to the meter reading server or the repeater. That is, the communication module 230 is connected with the meter reading server or the repeater via the wired and wireless network. When receiving the transmission request from the control module 220, the communication module 230 transmits the meter data included in the transmission request to the meter reading server or the repeater via the wired and wireless network.

The battery module 240 supplies driving power to the usage detection module, the control module 220, and the communication module 230. That is, the battery module 240 charges power through wireless power transmission, and discharges the charged power to the usage detection module, the control module 220, and the communication module 230 to supply driving power. At this time, the battery module 240 is, for example, composed of a secondary cell such as a nickel cell, an ion cell, a lithium ion cell, a polymer cell, a lithium polymer cell, or a lithium sulfide cell.

The wireless power receiving module 250 receives the power transmitted from the wireless power transmission device to charge the battery module 240. That is, the wireless power receiving module 250 receives power from the wireless power transmission device through the wireless power transmission method such as a magnetic induction (MI) method, a magnetic resonance (MR) method, or the like. The wireless power receiving module 250 charges the battery module 240 by using the received power. At this time, the wireless power transmission device is, for example, a meter reading terminal or a current transformer installed to a nearby power line.

The wireless power receiving module 250 receives power from the wireless power transmission device at a certain cycle interval to charge the battery module 240. The wireless power receiving module 250 may also request the wireless power transmission to the wireless power transmission device to charge the battery module 240 if the charged amount of the battery module 240 is reduced to a setting value or less.

Meanwhile, the electronic meters 100, 200 according to embodiments of the present disclosure may further include various sensors (for example, gas, temperature, motion, camera, and the like) to provide additional functions.

Figure 3:
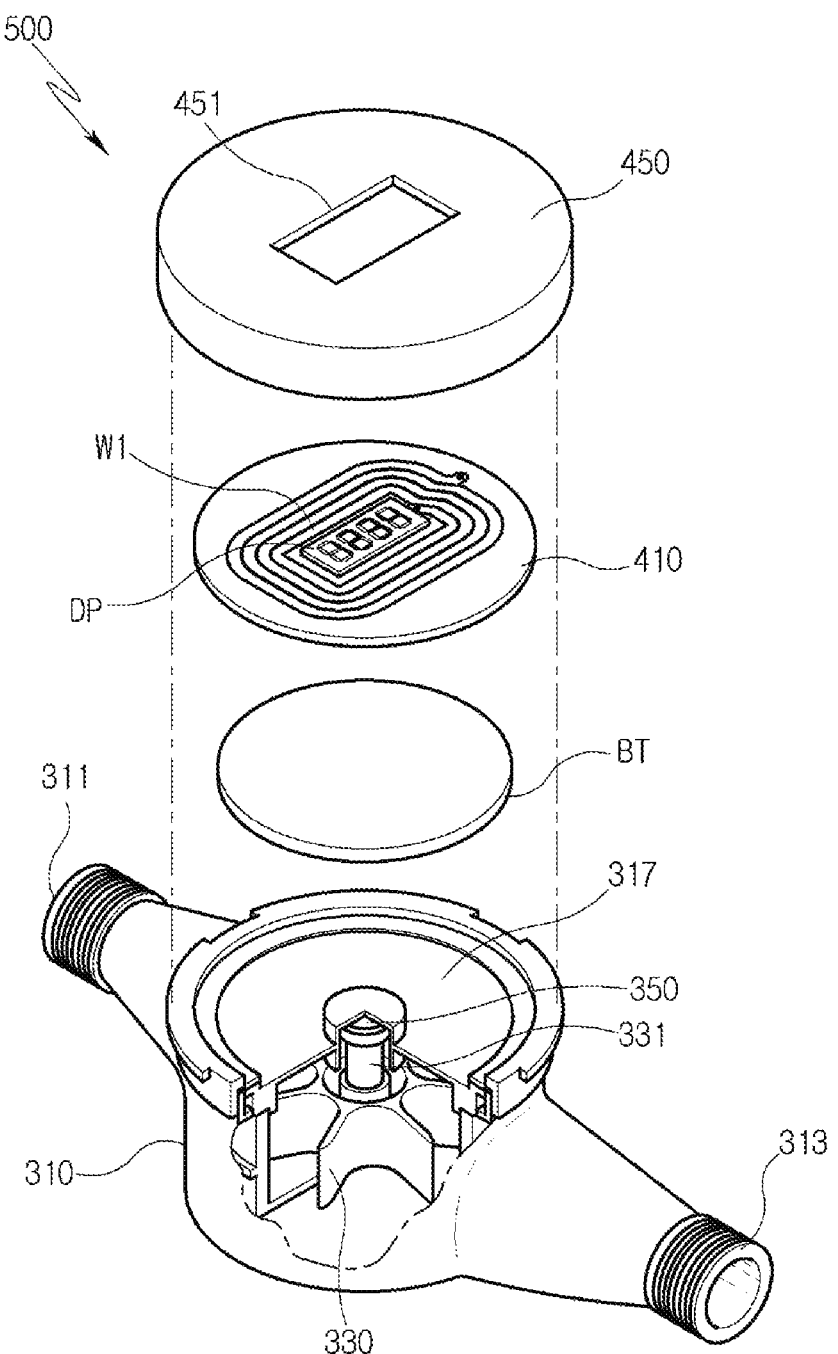
FIG. 3 is an exploded perspective diagram of an electronic meter according to a third embodiment of the present disclosure.
Figure 4:
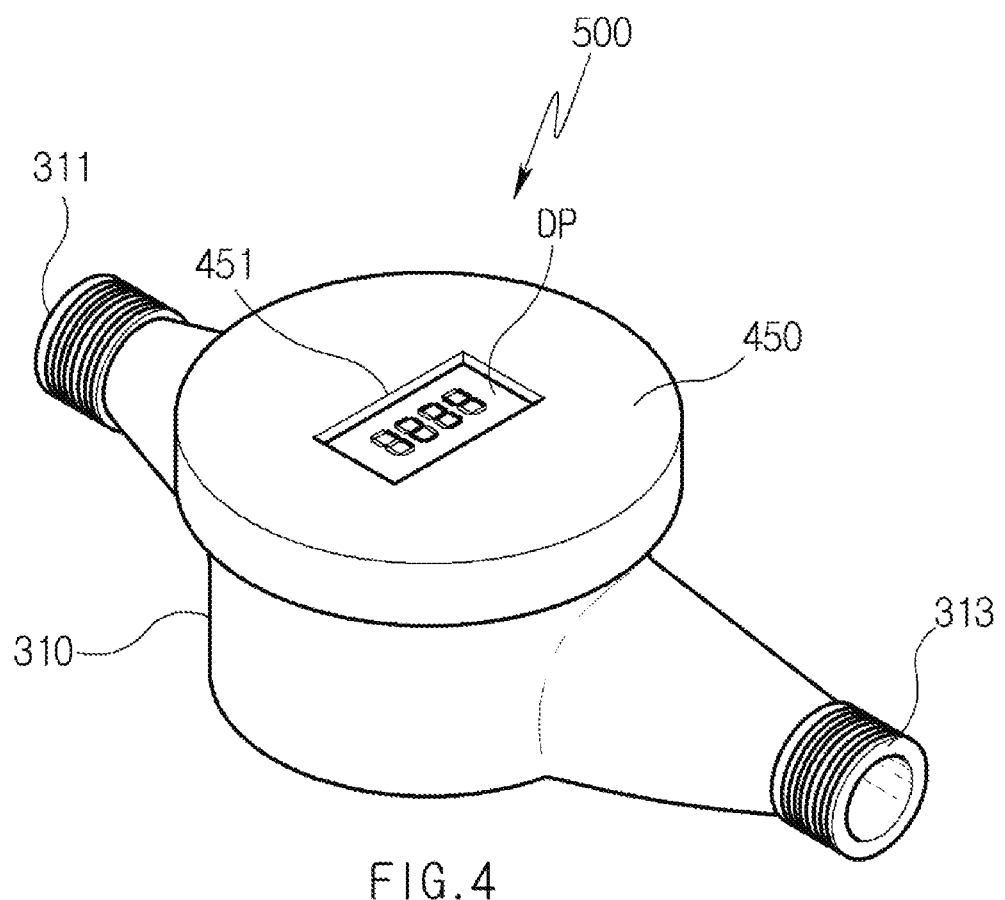
FIG. 4 is a perspective diagram of the electronic meter shown in FIG. 3.

Referring to FIGS. 3 and 4, an electronic meter 500 according to a third embodiment of the present disclosure includes a housing 310, an impeller 330, a permanent magnet 350, a rotary shaft 331, a cover plate 317, a circuit board 410, a wireless power receiving coil (W1), a display unit (DP), a rechargeable battery (BT), and a cover unit 450. Here, the wireless power receiving coil (W1) is a configuration which is included in the wireless power receiving module 150 of the electronic meter 100 described above, the rechargeable battery (BT) is a configuration which is included in the battery module 140 of the electronic meter 100 described above, and the usage detection module 110 and the control module 120 of the electronic meter 100 described above may be included in the circuit board 410.

The housing 310 includes an inlet 311 and an outlet 313. Each of the inlet 311 and the outlet 313 is coupled with a pipe, the fluid flowing through the pipe flows into the housing 310 through the inlet 311, and the fluid flowing into the housing 310 flows to the outside of the housing 310 through the outlet 313.

The impeller 330 is accommodated in the housing 310, and is coupled with the rotary shaft 331 positioned inside the housing 310. The impeller 330 is rotated by the flow of the fluid flowing along the flow path defined inside the housing 310 described above.

The permanent magnet 350 is disposed above the impeller 330, and the permanent magnet 350 is rotated by the flow of the fluid together with the impeller 330. Further, a sensor unit (not shown) for sensing the rotation of the permanent magnet 350 may be provided above the permanent magnet 350, and the sensor unit may sense the RPM of the permanent magnet 350 rotating together with the impeller 330 to confirm the flow rate of the fluid which rotates the impeller 330.

The cover plate 317 is coupled with the housing 310 to cover the impeller 330. Therefore, the fluid flowing into the housing 310 by the cover plate 317 may be prevented from being leaked to the display unit (DP), the rechargeable battery (BT), and the circuit board 410 sides.

The circuit board 410 is disposed on the cover plate 317 to overlap the display unit (DP) and the rechargeable battery (BT). In this embodiment, the circuit board 410 may include a plate-shaped insulating board and a circuit pattern formed on the insulating board, and the display unit (DP), the rechargeable battery (BT), and the wireless power receiving coil (W1) mounted on the circuit board 410 may be electrically connected to one another by the circuit pattern.

In another embodiment, the circuit board 410 may include polymer materials such as polyimide (PI) and polyethylene terephthalate (PET), and the circuit board 410 may have the characteristic of flexibility.

The rechargeable battery (BT) provides the power required for driving the electronic meter 500 to the electronic meter 500 side. In this embodiment, the rechargeable battery (BT) is electrically connected with a power terminal of the circuit board 410 through a separate power cable (not shown), and the rechargeable battery (BT) is accommodated between the cover plate 317 and the circuit board 410 to overlap the circuit board 410 and the wireless power receiving coil (W1). Therefore, the rechargeable battery (BT) may have a size approximately corresponding to the size of the circuit board 410, thereby maximizing the charging capacity of the rechargeable battery (BT).

In another embodiment, a rechargeable battery accommodating unit in which the rechargeable battery (BT) is seated may be provided separately at one side of the circuit board 410, and in this case, electrical terminals provided in the rechargeable battery accommodating unit may contact the electrodes of the rechargeable battery (BT), and the electrical terminals may be electrically connected with power terminals of the circuit board 410.

The wireless power receiving coil (W1) is disposed on the circuit board 410. In this embodiment, the wireless power receiving coil (W1) may be an antenna for wireless power transmission (WPT). The wireless power receiving coil (W1) charges the rechargeable battery (BT) in the wireless power receiving method. More specifically, the wireless power receiving coil (W1) may receive a wireless signal from an external wireless power transmission module (not shown) to generate power for charging the rechargeable battery (BT) in a magnetic resonance method, or to generate power for charging the rechargeable battery (BT) in a magnetic induction method.

In this embodiment, the wireless power receiving coil (W1) may be provided on one surface of the circuit board 410 in the form of a single conductor wiring. In another embodiment, the wireless power receiving coil (W1) may further include a conductor wiring provided on the other surface of the circuit board 410, and in this case, the conductor wirings formed on both surfaces of the circuit board 410 may be electrically connected to one another through via holes penetrating the circuit board 410.

Hereinafter, a structure of the wireless power receiving coil (W1) will be described in more detail further with reference to FIG. 5 as follows.

Figure 5:
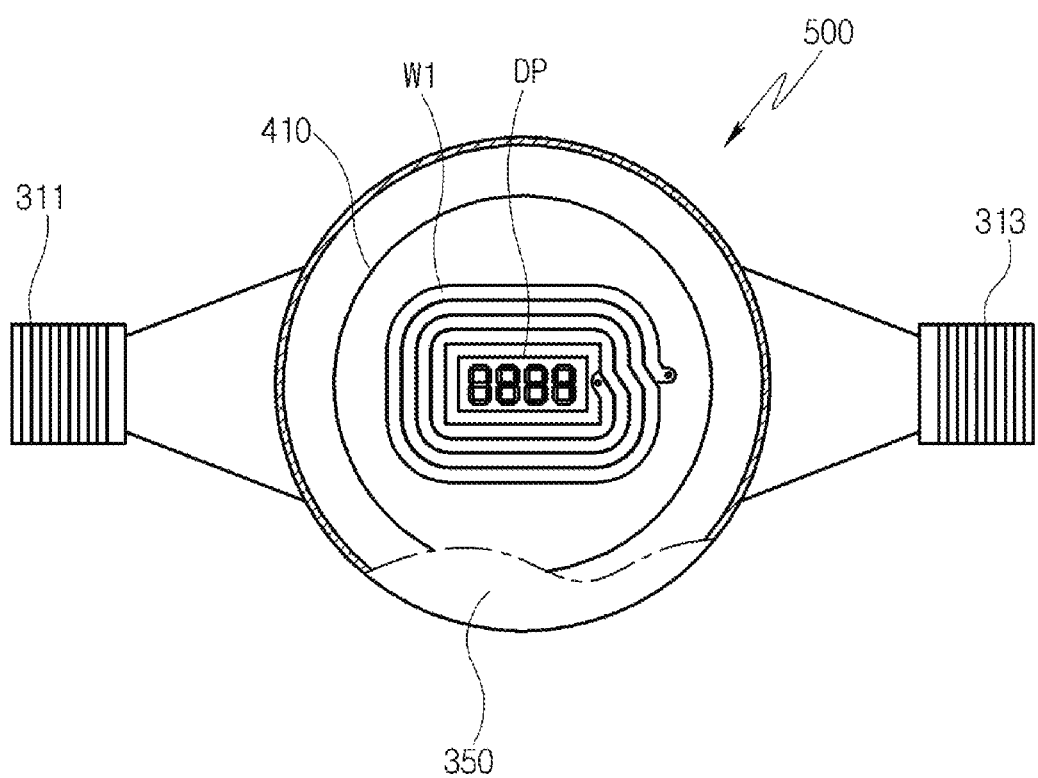
FIG. 5 is a plane diagram of the electronic meter shown in FIG. 3

Further referring to FIG. 5, the wireless power receiving coil (W1) is disposed on the circuit board 410, and the wireless power receiving coil (W1) is disposed around the display unit (DP) to have a shape of surrounding the display unit (DP). More specifically, the wireless power receiving coil (W1) may have a shape wound around the periphery of the display unit (DP) a plurality of times with respect to the display unit (DP).

Further, in this embodiment, the wireless power receiving coil (W1) approximately has a shape wound in a rectangular shape, but the present disclosure is not limited to the wound shape of the wireless power receiving coil (W1). The wireless power receiving coil (W1) may have a shape which is wound to correspond to the shape of the display unit (DP). For example, in another embodiment, if the shape of the display unit (DP) is circular or elliptical, the wireless power receiving coil (W1) may have a shape wound in a circular or elliptical shape so as to correspond to the shape of the display unit (DP).

As the wireless power receiving coil (W1) has the form of surrounding the display unit (DP), a space where the wireless power receiving coil (W1) is disposed may be sufficiently secured within the position range of the electronic meter 500 in which the wireless power receiving coil (W1) may receive wirelessly with the outside, and as a result, the time of charging the rechargeable battery (BT) may be minimized.

Further, since the display unit (DP) and the wireless power receiving coil (W1) are disposed in the electronic meter 500 toward the front of the electronic meter 500, the operator may easily position the wireless power transmission module (not shown) within a short distance of the wireless power receiving coil (W1) at a position of visually recognizing the display unit (DP). Therefore, the operator may perform the operation of charging the rechargeable battery (BT) of the electronic meter 500 while visually recognizing the display unit (DP).

Unlike an embodiment of the present disclosure, if the power supply source of the electronic meter may not be wirelessly charged, it may also be necessary to dismantle the sealing device of the electronic meter in order to replace the power supply source of the electronic meter. However, in the above-described embodiment of the present disclosure, since the rechargeable battery (BT) may be wirelessly charged, the operation of dismantling the sealing device (not shown) installed to the electronic meter 500 to charge the rechargeable battery (BT) and the operation of reinstalling the dismantled sealing device are not required.

The cover unit 450 is coupled with the housing 310 to cover the components accommodated inside the housing 310, and a separate sealing member may be provided to a portion where the cover unit 450 and the housing 310 are coupled to each other, thereby blocking moisture and foreign substances flowing into the housing 310 from the outside.

The cover unit 450 may include a display window 451 overlapping the display unit (DP). The display window 451 may be made of a transparent glass or a transparent plastic material. Therefore, the display unit (DP) may be visually recognized from the outside through the display window 451.

As described above, in this embodiment, the wireless power receiving coil (W1) is disposed on the circuit board 410, but in another embodiment, the wireless power receiving coil (W1) may be disposed on the inner surface of the cover unit 450, and more specifically, the wireless power receiving coil (W1) may be disposed around the display window 451 to be wound around the periphery of the display window 451 a plurality of times with respect to the display window 451. In this case, since the wireless power receiving coil (W1) is spaced apart from the circuit board 410, the degree of freedom of design of other elements mounted on the circuit board 410 may be improved.

Figure 6:
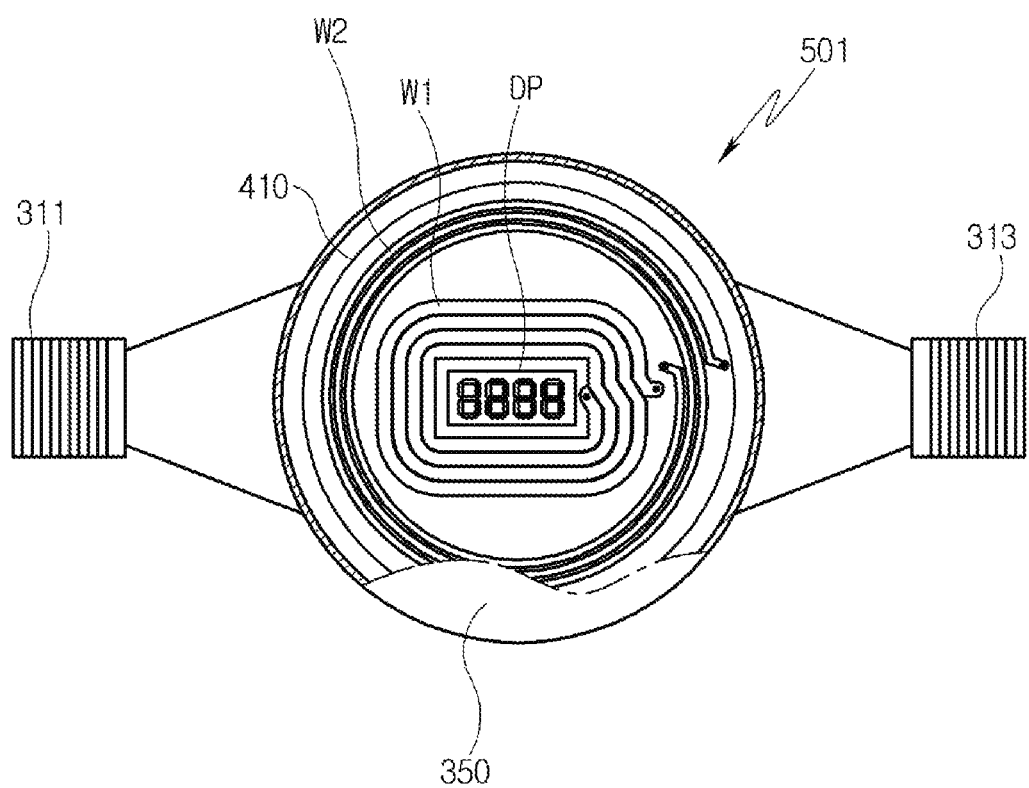
FIG. 6 is a plane diagram of an electronic meter according to a fourth embodiment of the present disclosure.

Referring to FIG. 6, an electronic meter 501 according to a fourth embodiment of the present disclosure includes the housing 310, the impeller 330, the permanent magnet 350, the rotary shaft 331, the cover plate 317, the circuit board 410, the wireless power receiving coil (W1), a wireless communication coil (W2), the display unit (DP), the rechargeable battery (BT), and the cover unit 450. Comparing the configuration of the electronic meter 501 shown in FIG. 6 with the configuration of the electronic meter (500 in FIG. 3) shown in FIGS. 3 and 5, the electronic meter 501 shown in FIG. 6 further includes the wireless communication coil (W2) as a component. Here, the wireless communication coil (W2) is a configuration which is included in the communication module 130 of the electronic meter 100 described above.

Therefore, in describing FIG. 6, components described with reference to FIGS. 3 to 5 are denoted by reference numerals, and overlapping descriptions of the components are omitted.

The wireless communication coil (W2) is disposed on the circuit board 410 together with the wireless power receiving coil (W1). In this embodiment, the wireless communication coil (W2) may be an antenna for near field communication (NFC). The wireless communication coil (W2) may be provided on one surface of the circuit board 410 in the form of a single conductor wiring, or the wireless communication coil (W2) may be provided in a plurality of wirings on both surfaces of the circuit board 410 to be electrically connected to one another through via holes penetrating the circuit board 410.

The wireless communication coil (W2) is spaced apart from the wireless power receiving coil (W1) on the circuit board 410, and the wireless communication coil (W2) surrounds the display unit (DP). Further, the wireless communication coil (W2) may have a shape wound around the periphery of the display unit (DP) a plurality of times with respect to the display unit (DP).

As described above, if the wireless power receiving coil (W1) is an antenna for WPT and the wireless communication coil (W2) is an antenna for NFC, the wireless communication coil (W2) may use a higher frequency band than that of the wireless power receiving coil (W1), such that the width of the wireless communication coil (W2) may be smaller than the width of the wireless power receiving coil (W1). Further, the wireless communication coil (W2) may have a shape of surrounding the wireless power receiving coil (W1), and the wireless communication coil (W2) may be disposed outside than the wireless power receiving coil (W1) on the circuit board 410.

In this embodiment, the wireless communication coil (W2) approximately has a shape wound in a rectangular shape, but the present disclosure is not limited to the wound shape of the wireless communication coil (W2). The wireless communication coil (W2) may have a shape which is wound to correspond to the shape of the display unit (DP), and in another embodiment, if the shape of the display unit (DP) is circular or elliptical, the wireless communication coil (W2) may have a shape wound in a circular or elliptical shape so as to correspond to the shape of the display unit (DP).

Meanwhile, as the wireless power receiving coil (W1) and the wireless communication coil (W2) are disposed inside the electronic meter 501, not only the rechargeable battery of the electronic meter 501 may be charged in the wireless power receiving method, but also the meter value of the water, gas or power metered by the electronic meter 501 may be easily provided to the outside wirelessly.

Further, since the wireless communication coil (W2) is mounted on the circuit board 410 together with the wireless power receiving coil (W1), the circuit board 410, the wireless power receiving coil (W1), and the wireless communication coil (W2) may be implemented in the form of one integrated module. Therefore, the wireless power receiving function and the wireless communication function described above may be easily implemented in the electronic meter 501.

As described above, although the preferred embodiment according to the present disclosure has been described, it is understood that changes may be made in various forms, and those skilled in the art may practice various changed examples and modified examples without departing from the claims of the present disclosure.

The invention claimed is:

1. An electronic meter, comprising:
   a display unit for displaying a meter value of a flow rate;
   a circuit board overlapping the display unit;
   a rechargeable battery for providing power to the display unit; and
   a wireless power receiving coil disposed on the circuit board to dispose around the display unit, and for receiving power wirelessly from the outside to charge the rechargeable battery,
   wherein the wireless power receiving coil surrounds the display unit, and
   wherein the rechargeable battery overlaps the wireless power receiving coil with the circuit board interposed therebetween.

2. The electronic meter of claim 1,
   wherein the wireless power receiving coil is wound around the periphery of the display unit a plurality of times with respect to the display unit.

3. The electronic meter of claim 1, further comprising a wireless communication coil disposed on the circuit board to wirelessly transmit a metered meter value to the outside,
   wherein the wireless communication coil is disposed around the display unit to be spaced apart from the wireless power receiving coil.

4. The electronic meter of claim 3,
wherein the wireless communication coil surrounds the display unit.

5. The electronic meter of claim 3,
wherein the wireless communication coil is wound around the periphery of the display unit a plurality of times with respect to the display unit.

6. The electronic meter of claim 4,
wherein the wireless communication coil surrounds the wireless power receiving coil.

* * * * *